(12) United States Patent
Bert et al.

(10) Patent No.: US 10,930,677 B2
(45) Date of Patent: *Feb. 23, 2021

(54) ALTERNATIVE DESIGNS FOR ADDRESSING CONTACTS THAT ENHANCE BEND ABILITY OF TFT BACKPLANES

(71) Applicant: Palo Alto Research Center Incorporated, Palo Alto, CA (US)

(72) Inventors: Julie A. Bert, East Palo Alto, CA (US); Robert A. Street, Palo Alto, CA (US); John C. Knights, Soquel, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 421 days.

This patent is subject to a terminal disclaimer.

(21) Appl. No.: 15/951,301

(22) Filed: Apr. 12, 2018

(65) Prior Publication Data

US 2019/0319049 A1 Oct. 17, 2019

(51) Int. Cl.
| | | |
|---|---|---|
| *H01H 47/00* | (2006.01) | |
| *H01L 27/12* | (2006.01) | |
| *H01L 25/10* | (2006.01) | |
| *H01L 29/786* | (2006.01) | |
| *H01L 27/146* | (2006.01) | |
| *H01L 25/00* | (2006.01) | |

(52) U.S. Cl.
CPC ........ *H01L 27/1218* (2013.01); *H01L 25/105* (2013.01); *H01L 25/50* (2013.01); *H01L 27/1222* (2013.01); *H01L 27/14661* (2013.01); *H01L 29/78663* (2013.01); *H01L 29/78672* (2013.01); *H01L 29/78693* (2013.01)

(58) Field of Classification Search
None
See application file for complete search history.

(56) References Cited

U.S. PATENT DOCUMENTS

| | | | | |
|---|---|---|---|---|
| 6,531,662 B1* | 3/2003 | Nakamura | ........ | H01M 10/4257 |
| | | | | 174/254 |
| 2010/0002402 A1* | 1/2010 | Rogers | ................ | H01L 21/4867 |
| | | | | 361/749 |
| 2016/0037633 A1* | 2/2016 | Downs | ..................... | H05K 3/02 |
| | | | | 361/749 |

OTHER PUBLICATIONS

Venugopal, et al "Integrated a-Si:H Source Drivers for 4" QVGA Electrophoretic Display on Flexible Stainless Steel Substrate", J. Display Tech. V. 3, N. 1, Mar. 2007, pp. 57-63.
Kim, et al. "Ultra-Thin Chip-in-Flex (CIF) Technology Using Anisotropic Conductive Films (ACFs) for Wearable Electronics Applications", 2015 Electronic Components & Technology Conference; 978-1-4799-8609-5/15/$31.00 © 2015 IEEE.
Burghartz Ed. "Ultra-thin Chip Technology and Applications", © Springer Science+Business Media 2011 ISBN 978-1-4419-7275-0—471 pgs.

* cited by examiner

*Primary Examiner* — Stephen W Jackson
(74) *Attorney, Agent, or Firm* — Fay Sharpe LLP (57) ABSTRACT

Various designs are provided to mitigate or solve limitation on the bendability of an active matrix backplanes: including breaking large rigid silicon chips (ICs) into smaller rigid ICs, changing the orientation of rigid ICs, changing the placement of the ICs on the array, thinning the ICs to the point where the Si is flexible, and replacing the ICs with high quality TFT processing which can be done on flexible substrates.

16 Claims, 9 Drawing Sheets

ALTERNATIVE DESIGNS FOR ADDRESSING CONTACTS THAT ENHANCE BEND ABILITY OF TFT BACKPLANES

BACKGROUND

The process for fabrication of electronic TFT backplanes on glass using an amorphous silicon (a-Si) thin film transistor (TFT) array which addresses an array of a-Si elements is well known in the art. Such TFT backplanes have a large variety of uses. One exemplary use is as part of digital x-ray detectors. In this use an x-ray scintillator is placed in contact with the backplane to down convert x-rays to light that can be detected by photodiodes. The scintillator is typically either Tb-doped gadolinium oxysulphide (GOS) or CsI, but other materials are possible. GOS is incorporated with a binder to form a thin flexible sheet which is pushed or adhesively bonded into contact with the backplane. Alternatively, CsI may be deposited directly on the backplane or formed as a separate layer and pushed or adhesively bonded into contact. An alternative approach, which eliminates the need for a separate scintillating layer, is to use an x-ray photoconductor, such as selenium, to form photodiodes which are then address by a very similar TFT array. The current application applies to either type of structure.

The same TFT backplane structures can be manufactured using a flexible (e.g., plastic) substrate instead of glass. There are various ways to make a backplane on a flexible substrate. A common method that is used in current manufacturing is to form a thin polyimide (PI) layer on a conventional glass substrate. The backplane is then manufactured with the same process as if it were on glass without the PI layer. Then for use as a digital x-ray detector, a scintillator is bonded to the front surface to give support to the thin PI film and the a-Si backplane layers. The combination is then released from the glass substrate and a plastic layer can be bonded to the back side for additional protection. The flexible nature of the plastic substrates and GOS scintillator make the x-ray imager bendable.

Bendable TFT backplanes are of interest in many areas. Some examples include use as bendable detectors in the areas of: inspection of pipelines or other curved objects, imaging objects in confined spaces where rigid flat detectors cannot be introduced, and to conform to the human body for added comfort and resolution.

BRIEF DESCRIPTION

An active matrix backplane arrangement including: a TFT backplane formed on a flexible substrate; and gate addressing circuits and data addressing circuits configured to address the TFT backplane, wherein at least one of the gate addressing circuits and the data addressing circuits are at least one of configured or positioned to enhance bendability of the arrangement.

The arrangement wherein the gate addressing circuits are gate chip on flex (COF) packages, and the data addressing circuits are data chip on flex (COF) packages.

The arrangement wherein the gate addressing circuits and the data addressing circuits include rigid silicon chips in the COF packages and at least one rigid gate silicon chip or rigid data silicon chip is purposely manufactured with fewer address lines resulting in a smaller chip, and a single one of these smaller silicon chips is provided to an individual COF package.

The arrangement wherein the gate addressing circuits and the data addressing circuits include rigid silicon chips in the COF packages and at least one rigid gate silicon chip or rigid data silicon chip is purposely manufactured with fewer address lines resulting in a smaller chip, and multiple ones of the smaller than standard silicon chips are provided to an individual COF package.

The arrangement wherein the gate addressing circuits and the data addressing circuits include rigid silicon chips in the COF packages, and wherein each of the rigid silicon chips are oriented in the COF package so that their longest dimensions are parallel when connected to the TFT backplane.

The wherein the gate addressing circuits and the data addressing circuits include rigid silicon chips in the COF packages, and wherein gate COFs and data COFs are collinearly placed along a same side of the TFT backplane.

The arrangement wherein the gate addressing circuits and the data addressing circuits include rigid silicon chips in the COF packages, and wherein each of the gate COF packages include at least a single silicon chip, the at least single silicon chip being a thinned IC, wherein the thickness of the thinned IC is less than 50 µm in thickness.

The arrangement wherein the gate addressing circuits and the data addressing circuits are mounted directly to the flexible substrate.

The arrangement wherein the gate addressing circuits and the data addressing circuits include at least one thinned silicon chip located directly on the flexible substrate, and wherein the thickness of the thinned silicon chip is less than 50 µm thickness.

The arrangement wherein the gate addressing circuits are formed using low temperature poly-Si (LTPS), and the data addressing circuits include silicon chips in the COF packages.

The arrangement wherein the gate addressing circuits are formed using amorphous Indium Gallium Zinc Oxide (a-IGZO) or other metal oxide, and the data addressing circuits include silicon chips in the COF packages.

The arrangement wherein the gate addressing circuits and the data addressing circuits and all other silicon ICs are all thin circuits equal to or less than 50 µm in thickness, and all the thin circuits are directly bonded to the bendable substrate, with no printed circuit board in the arrangement.

The arrangement wherein the TFT backplane formed on bendable substrate which is a plastic substrate, with gate and data addressing circuits modified from conventional COF or chip on glass packages to enhance the bendability of the TFT backplane.

The arrangement wherein the TFT backplane arrangement is an x-ray detector backplane.

The arrangement being one of a liquid crystal display (LCD), an organic liquid crystal display (OLED) and a reflective display.

A method of forming a bendable TFT backplane arrangement including forming a TFT backplane on a flexible substrate; and configuring gate addressing circuits and data addressing circuits configured to address the TFT backplane, wherein at least one of the gate addressing circuits and the data addressing circuits are at least one of configured or positioned to enhance bendability of the arrangement.

DETAILED DESCRIPTION

Figure 1:
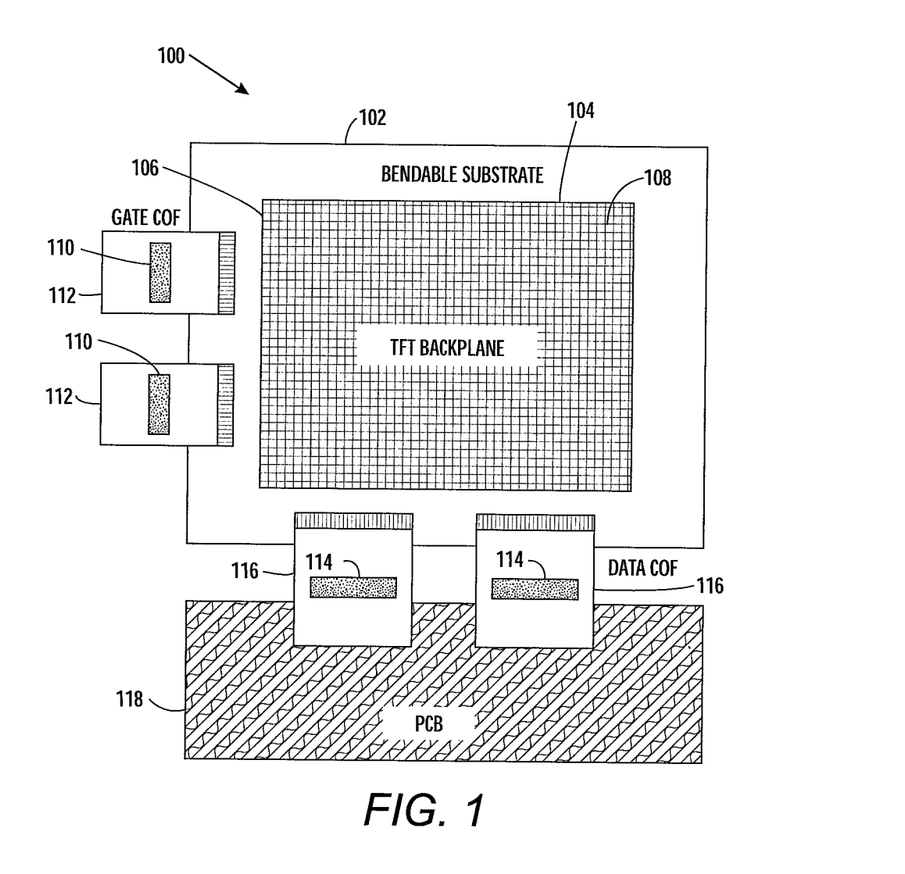
FIG. 1 illustrates conventional structure of an active matrix TFT backplane with gate drivers and data readout on adjacent sides of the backplane.

As illustrated in FIG. 1, an active matrix backplane arrangement 100 includes a bendable substrate 102 and a TFT backplane 104, which is traditionally addressed by two sets of parallel lines running perpendicular to each other across the TFT backplane 104, identified as gate lines 106, and data lines 108. Also included, as known in the art, are a plurality of TFTs and associated elements (not shown for clarity of the drawing) where the gate lines 106 are connected to TFT gates of every TFT in a row, and the data lines 108 connected to TFT drain (or source) of every TFT in a column. As known in the art, for a TFT array engineered for a sensing application accumulated charge is read out by sequentially applying a voltage pulse to the gate lines of the TFTs (also called scan lines) while reading out the charge signal on the data lines. For example, when used as part of a digital x-ray detector the charge accumulated on photodiodes of a pixel by incident photons is read out by sequentially applying a voltage pulse to the gate lines of the TFTs while reading out the charge signal on the data lines.

With continuing attention to FIG. 1, voltage pulses that activate gate lines 106 are generated by shift registers usually in the form of silicon integrated circuits (e.g., gate chips) 110. Typically gate chips 110 are mounted or incorporated with a fan-out element, e.g., in the form of a chip-on-flex (COF) package or a chip on glass (COG) package 112. For flexible applications COF packages are used. FIG. 1 shows a typical arrangement with packaged gate drivers 110 bonded or mounted to the bendable substrate 102 of the TFT backplane arrangement 100. Data drivers or readout chips 114 are shown mounted or incorporated with a fan-out element, e.g., in the form of COF packages or COG packages 116. The data chip packages themselves are bonded or mounted to the bendable substrate 102 and to a printed circuit board (PCB) 118. The data chip fan-out packages 116 are often connected directly to a PCB 118, but many of the available gate chips 110 do not need a connection to a PCB. It is also noted that the PCB 118 in certain designs will carry other ICs to perform specific operations which interact with the gate and data chips on the fan-out packages previously discussed.

Due to the flexible (but not stretchable) nature of the TFT backplane 100, one dimensional bending should be possible along any linear axis. However, the chips (e.g., gate chips 110 and data chips 114) in the fan-out packages (112 and 116) and the PCB itself are typically rigid severely limiting bendability of the complete structure. Therefore the present disclosure sets forth appropriately designed data and gate fan-out packages and/or flexible PCBs that significantly enhance the overall bendability of active matrix backplane arrangements described below. For bendable applications the COF package is preferred because its flexible substrate can bend with the flexible backplane. All further reference to fan-out packages will refer to them as COFs or COF packages and assume use of a flexible substrate. It is to be understood the bendable substrate, TFT backplane, and PCB as described in the arrangements below may have characteristics such as the bendable substrate, TFT backplane and PCB described above.

Figure 2:
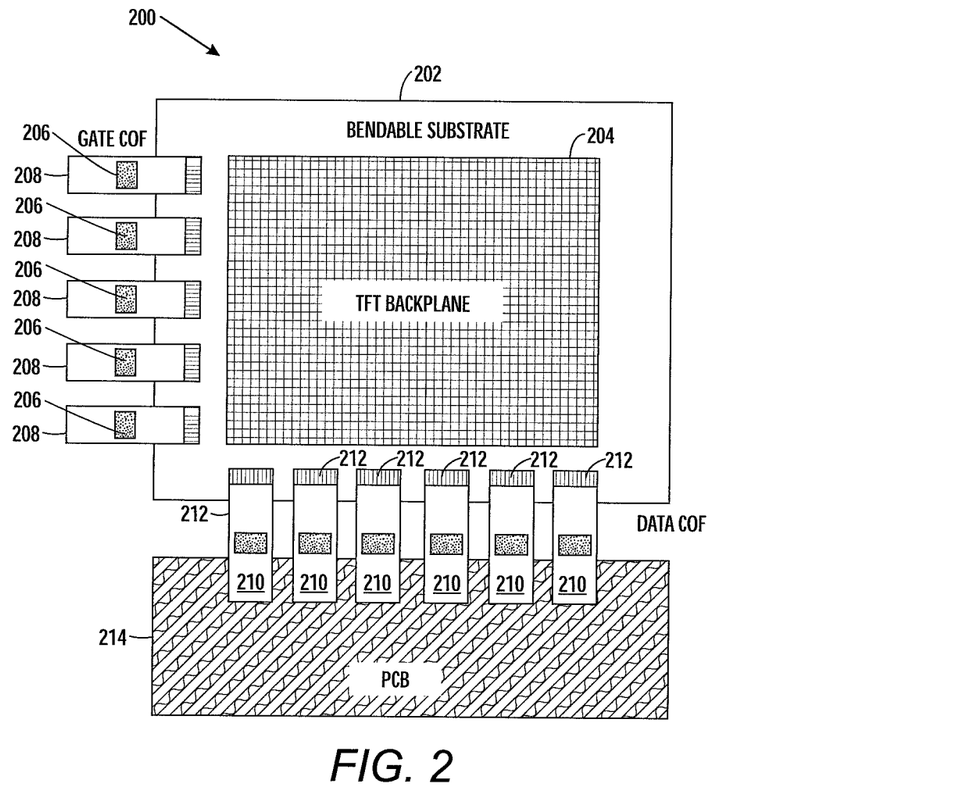
FIG. 2 illustrates a flexible backplane design that substitutes few larger COF/IC packages for many smaller COF/IC packages.

Turning to FIG. 2, illustrated is an active matrix backplane arrangement 200 including bendable substrate 202 and TFT backplane 204, designed where single silicon gate and data chips (ICs) (such as shown in FIG. 1) are divided into smaller gate chips 206, in COF packages 208, and data chips 210, in COF packages 212. The COF packages 208 shown being optionally mounted on a second PCB similar to the PCB 214 connected to the data COFs 212.

To decrease labor involved in bonding COF packages the trend in the industry has been to include a greater number of line connections in a single silicon IC and COF package resulting in longer pieces of rigid silicon in fewer total COF packages. Although the COF package itself is flexible, the length of the rigid silicon IC in existing backplane arrangements directly limits the continuity of the curvature of such arrangements. In the embodiment shown in FIG. 2, replacing a single silicon IC with a number of smaller ICs increases the continuity of the curvature of the backplane arrangement. These smaller ICs 206, 210 are shown mounted in separate COF packages 208, 212.

Figure 3:
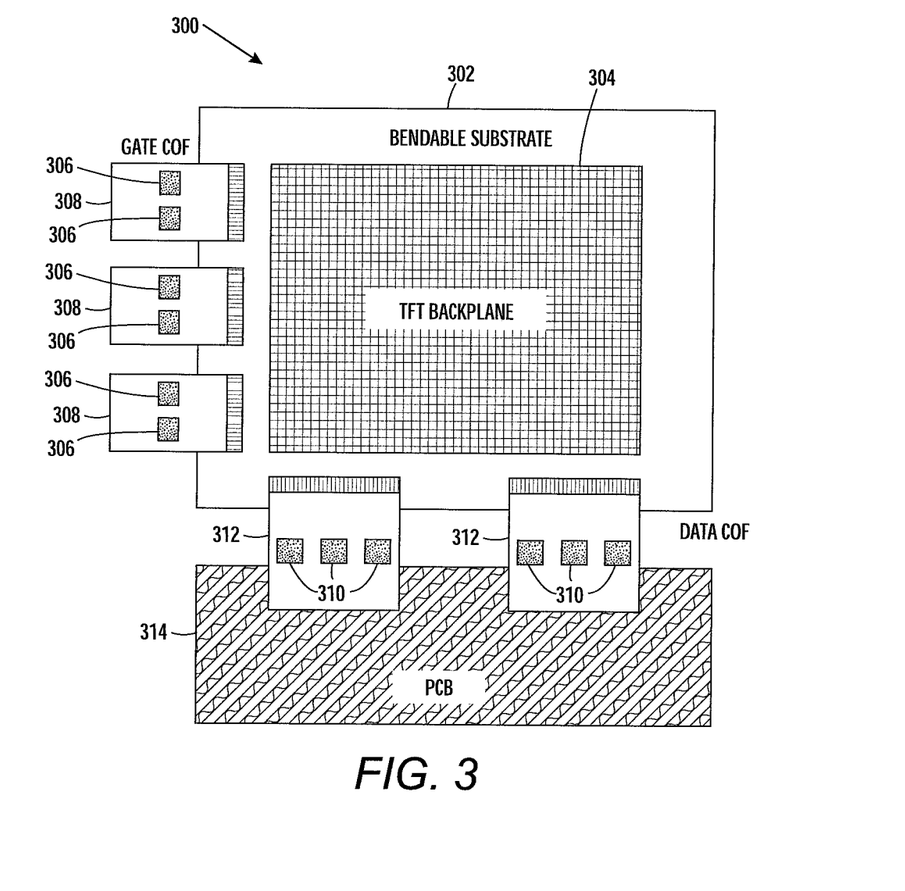
FIG. 3 illustrates a flexible backplane design that integrates many small silicon ICs into larger COF packages.

Turning to FIG. 3, an alternative active matrix backplane arrangement 300 is depicted with bendable substrate 302 and TFT backplane 304. In this embodiment smaller gate chips (ICs) 306 are combined into larger COF packages 308, and the smaller data chips (ICs) 310 are combined into larger COF packages 312, which acts to reduce bonding complexity. PCB 314 is also shown.

It is common that the length of certain silicon chips (ICs), specifically gate or data chips that must address individual lines, is limited by the pitch of the bond pads that connect the lines to the IC. Current state of the art bond pads for COF packages are positioned in two staggered rows around the edge of a chip with a pitch between 10 µm and 50 µm. The more lines addressed by a chip the longer a chip needs to be. Standard address line quantities are large with minimum quantities starting at 128 or 256 channels per data chip and growing from there. In certain embodiments herein, the gate chips 206, 306 and/or the data chips 210, 310 are broken into, during manufacturing, address line quantities (channels) that are smaller than standard. In certain embodiments in a range of less than 32 channels, in other embodiments the gate chips 206, 306 and/or the data chips 210, 310 are in a range of between 32 and 128 channels. In still other embodiments the gate chips 206, 306 and/or the data chips 210, 310 are in a range of between 128 and 256 channels. It is further understood that number of channels from the various embodiments may be combined in various designs, where for example gate chips of 32 channels may be used with data chips of 128 channels. This is of course one example only and other combinations may be used.

Figure 4:
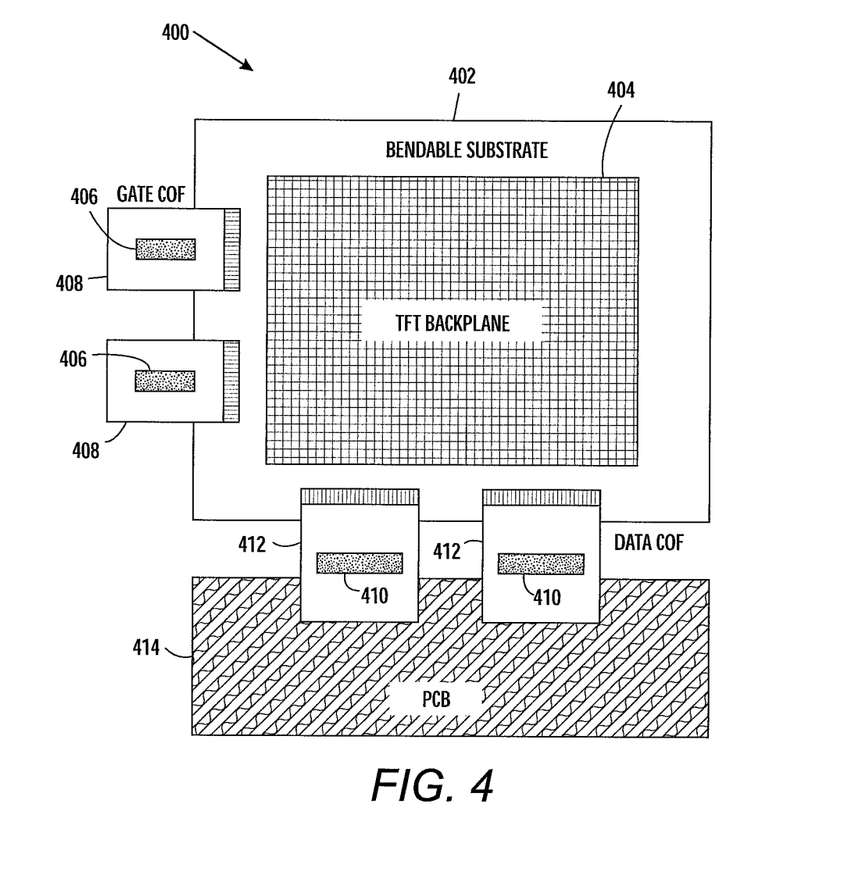
FIG. 4 illustrates a flexible backplane with curvature along the gate lines with the rigid silicon ICs rotated by 90 degrees in the COF gate driver packages.

Turning to FIG. 4, illustrated is an active matrix backplane arrangement 400 with a bendable substrate 402 and TFT backplane 404. In this embodiment gate chips 406 are positioned as part of COFs 408, along with data chips 410 positioned to be part of COFs 412. The rigid gate chips (ICs) 406 are reoriented within the COF package 408 by substantially 90 degrees from vertical to align in the same axis as the data chips 410. If the PCB 414 remains rigid then one dimension bending of the backplane arrangement 400 is done with curvature in the direction of the gate lines 416.

Figure 5:
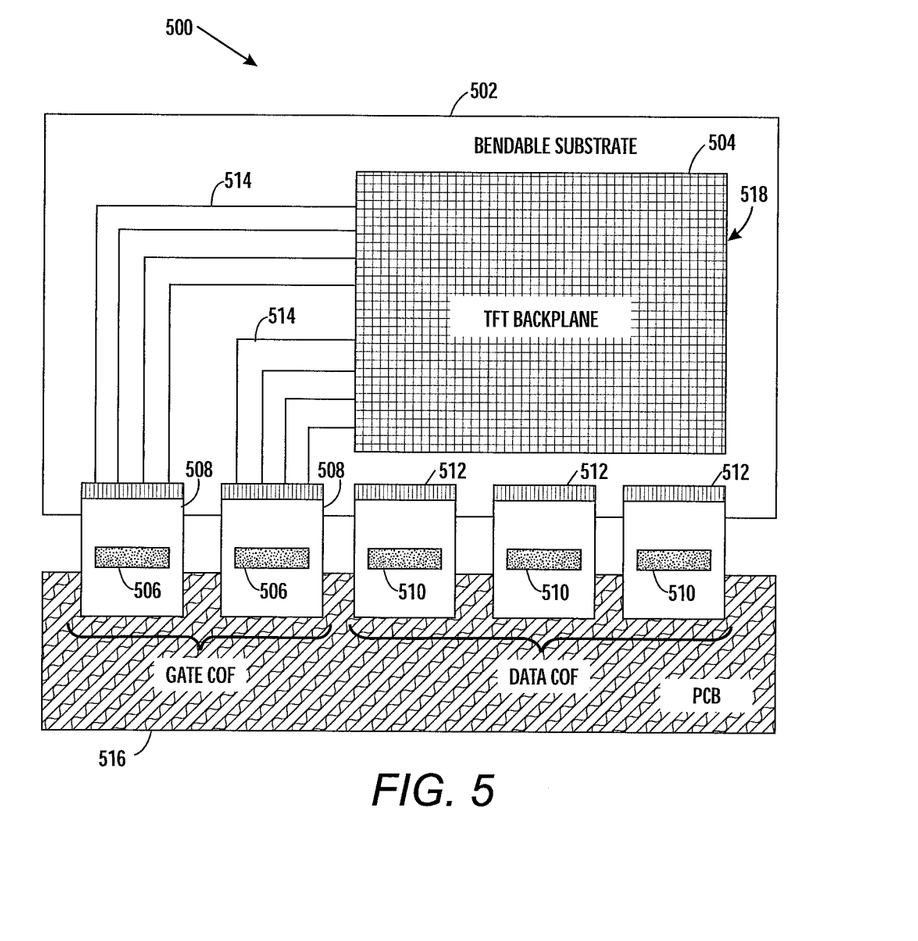
FIG. 5 illustrates placing all COF packages with rigid ICs in a single line near the PCB to allow for continuous bendability of the detector above the line of COF packages.

Turning to FIG. 5, illustrated is an embodiment of an active matrix backplane arrangement 500 including a bendable substrate 502 and TFT backplane 504, along with gate chips 506 (ICs) positioned on COFs 508, and data chips (ICs) 510 positioned on COFs 512. In this design the gate COF packages (i.e., with the gate chips 506) are collinearly placed or mounted along the same edge as data COF packages 512. It is also possible to place the gate COF parallel to the data COFs on the edge opposite the data COFs. This is accomplished in one design by extending connection lines 514 between the TFT backplane 504 and the gate COFs 508 as shown. Similar to the design of FIGS. 2 and 3, if PCB 516 remains rigid then improvement in bendability is substantially along the axis of the gate lines 518. Which as depicted is accomplished by moving the gate COF packages 508 to the same side of the TFT backplane array 504 as the data COF packages 512. This design places all the rigid silicon chips (ICs) 506, 510 along the same line in order to eliminate the impact of the rigid silicon chips (ICs) on the continuity of bendability along the direction of the gate lines 518.

Figure 6:
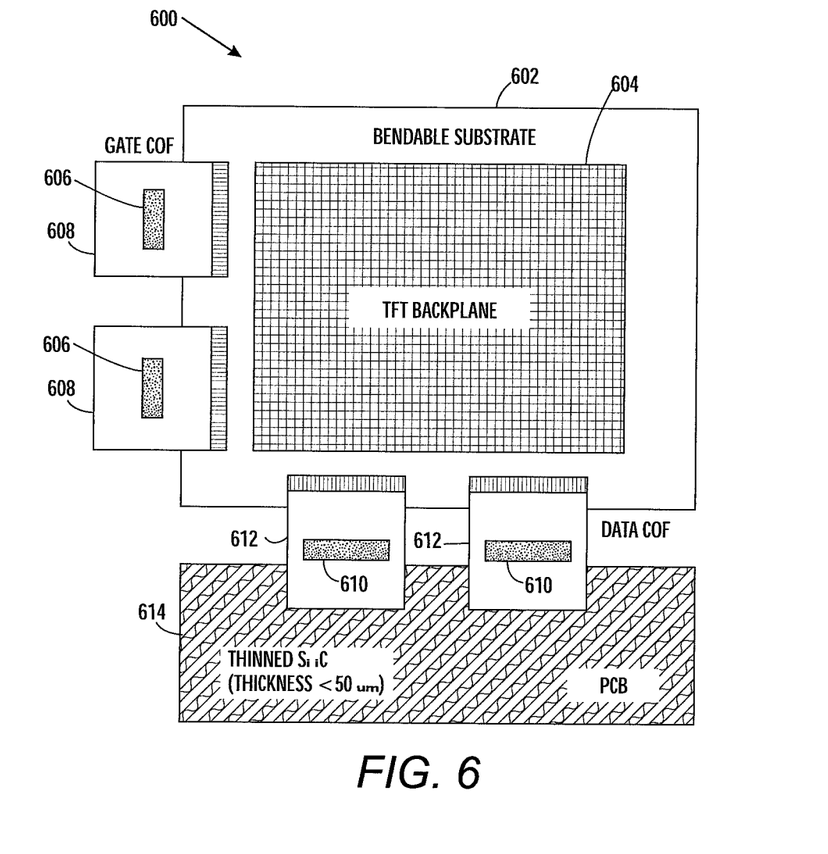
FIG. 6 illustrates a flexible backplane packaging design using into thinned Si chips integrated into fully flexible COF packages for gate and data driver ICs which can eliminate the constraints imposed by those rigid chips on the backplane bendability.

Turning to FIG. 6 illustrated is an embodiment of an active matrix backplane arrangement 600 including a bendable substrate 602 and TFT backplane 604, along with gate chips 606 positioned on COFs 608, and data chips 610 positioned on COFs 612. The COF packages 612 shown being optionally mounted on a PCB 614.

The embodiment of FIG. 6 includes employment of thinned silicon chips (e.g., gate chips 606, and data chips 610) which make such chips (606, 610) flexible. They are mounted as part of the COF packages (608, 612) which are connected to bendable backplane 602, where COF packages 612 is further optionally attached to PCB 614.

It is understood that standard silicon wafers are hundreds of microns thick and are rigid and brittle. Yet the electrical elements themselves only penetrate the top 5-10 μm of the wafer. Typical silicon IC processing dices a wafer into individual IC chips. Because commonly nothing special is done to reduce the thickness, the IC chips have a thickness equal to the original wafer thickness making them also rigid and brittle. However, at thickness below 50 μm silicon wafers and chips become flexible. Methods to thin silicon ICs are known in the art. Bonding such a thinned chip onto a flexible COF package or the array substrate eliminates the only rigid component near the back plane and allows for continuous flexibility as opposed to the segmented flexibility constraint the rigid silicon imposed.

Figure 7:
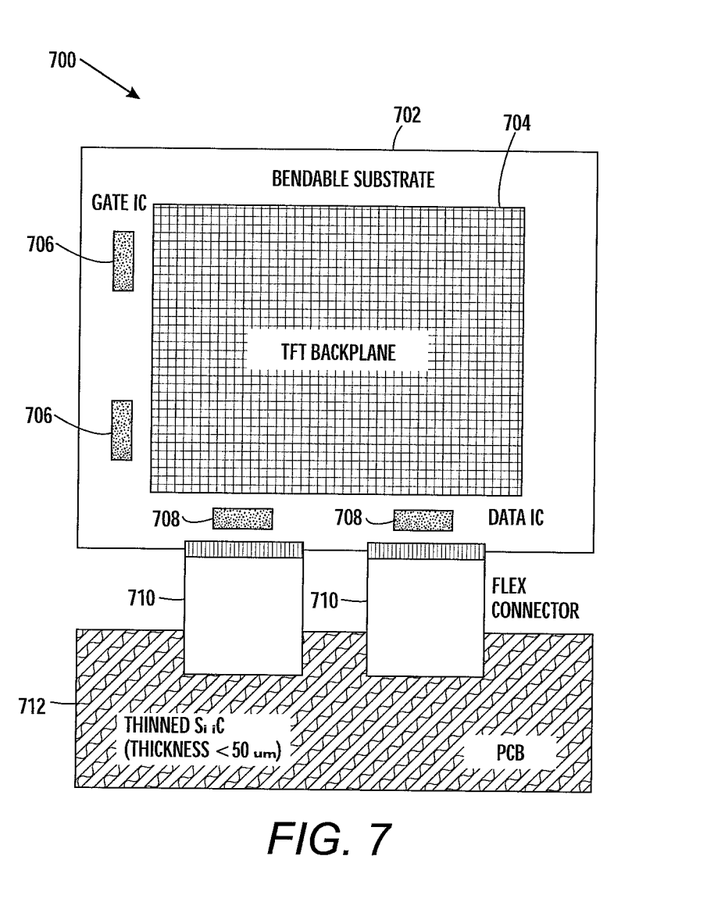
FIG. 7 illustrates a flexible backplane packaging design which bonds thinned gate and data ICs directly to the flexible backplane substrate.

In FIG. 7 illustrated is an embodiment of an active matrix backplane arrangement 700 including a bendable substrate 702 and TFT backplane 704, along with gate chips 706 and data chips 708 being mounted or bonded directly to bendable substrate 702. Also shown in FIG. 7 are flex connectors 710 provided as a connection between the data chips 708 and other chips (ICs) (not shown) that can be provided on PCB 712. The gate and data chips (ICs) 706, 708 bonded or mounted to bendable substrate 702, are thinned ICs as discussed in connection with FIG. 6. Permitting increased flexibility of the active matrix backplane arrangement 700.

Figure 8:
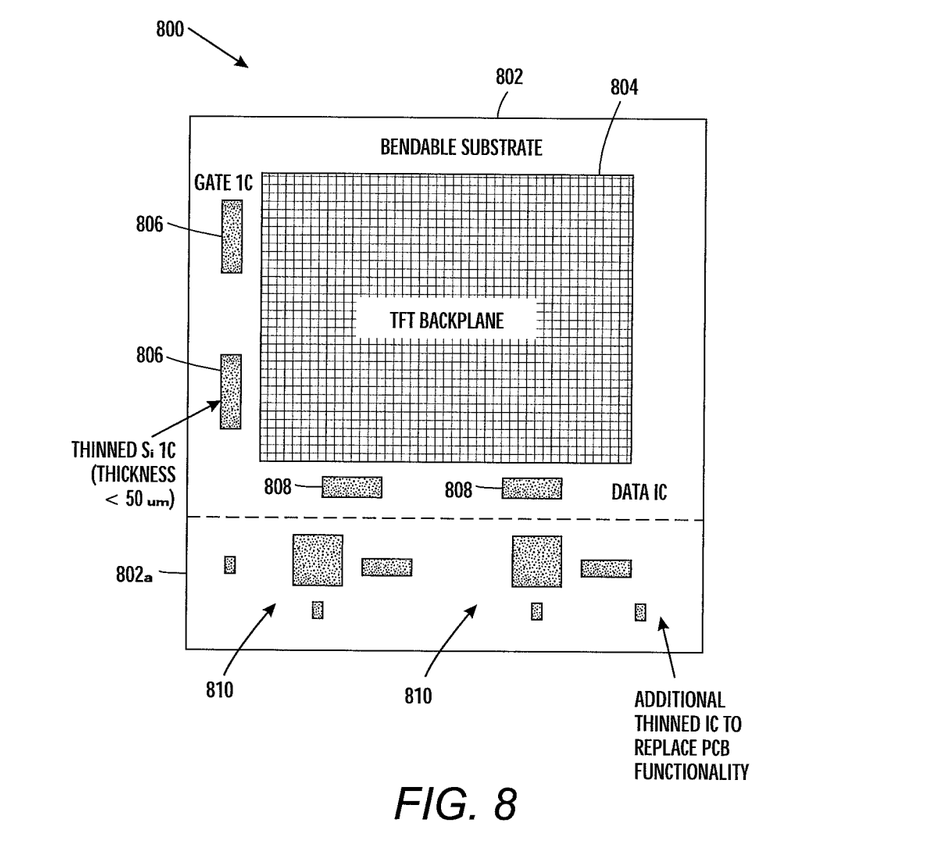
FIG. 8 illustrates a flexible backplane packaging design which enlarges the flexible backplane substrate and bonds all thinned silicon ICs including the gate and data ICs and all ICs previously located on the external PCB directly to the backplane substrate to create a fully bendable backplane.

Turning to FIG. 8, a further embodiment employing the thinned ICs component is provided. More particularly, FIG. 8 illustrates an active matrix backplane arrangement 800, including a bendable substrate 802 and TFT backplane 804, along with gate chips 806 and data chips 808 mounted or bonded directly to the bendable substrate 802. In this design, the PCB (e.g., of FIG. 7) is replaced with additional bendable backplane material 802a, on which other thinned chips (ICs) 810 are mounted. These other ICs 810 are specific to the implementation to which the active matrix backplane arrangement 800 is to be used. Removal of the PCB in combination with utilization of the thinned chips (ICs) increases flexibility by eliminating almost all rigid components.

The gate driver is actually a simple shift register digital circuit and can be fabricated directly on the bendable substrate. Building the gate driver circuits on the bendable substrate acts to eliminate rigid gate driver chips. The a-Si TFT technology that is used to address individual elements (e.g., for a detector pixels) in the flexible TFT backplane lacks the performance metrics for mobility to be useful in high performance circuits like shift registers. However, other materials including low temperature poly-Si (LIPS) and amorphous Indium Gallium Zinc Oxide (a-IGZO) and other oxides that are compatible with the backplane fabrication process can be used to make sufficiently high performance TFTs for building gate drivers directly onto the backplane substrate, as is known in the art.

Figure 9:
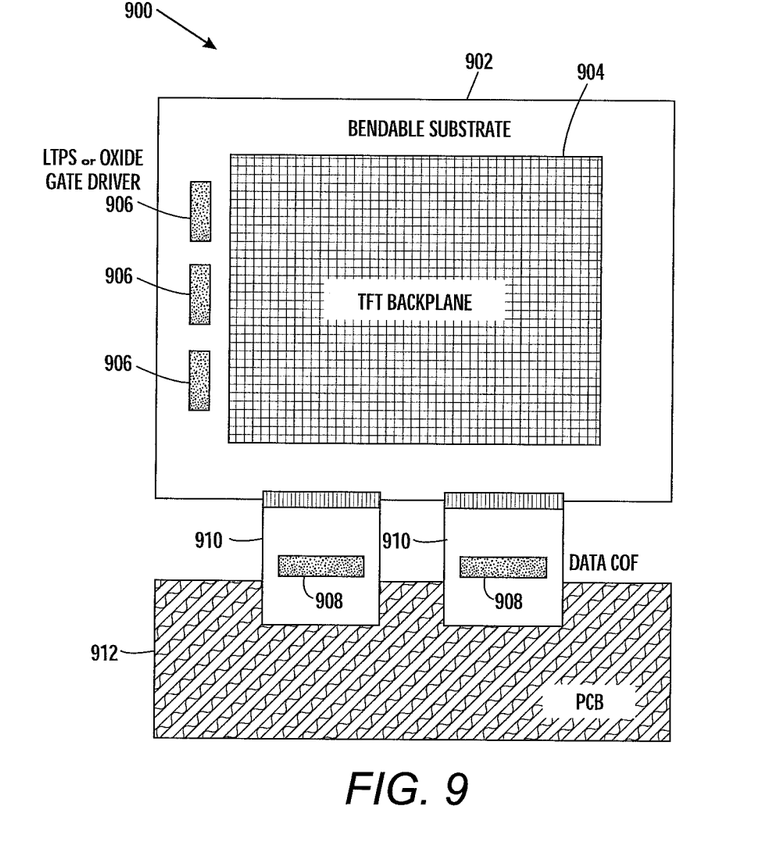
FIG. 9 illustrates fabricating LTPS or oxide TFT gate driver directly on the flexible backplane to allow for continuous bendability of the backplane above the line of COF data packages.

Turning to FIG. 9 illustrated is an embodiment of an active matrix backplane arrangement 900, including a bendable substrate 902 and TFT backplane 904, along with gate driver circuits 906 that are fabricated directly on the flexible substrate 902, and data chips 908 in COF packages 910. In this embodiment the COFs are connected to PCB 912.

The embodiment illustrated in FIG. 9 employs a LIPS or a-IGZO gate driver 906 fabricated directly onto bendable substrate 902 to replace the rigid Si IC gate driver of existing backplanes, thereby eliminating the bendability limitations along the gate driver axis. Alternatively, the shift register is fabricated on a separate flexible substrate and bonded to the array in a similar way that the COF packages are bonded. Fabrication on a separate substrate makes it easier to use a different TFT technology for the shift register (e.g. polysilicon) from that of the TFT backplane array (e.g. a-Si).

An aspect of the present disclosure as described is the modification to packaging, orientation, placement and/or structure of the backplane gate drive integrated circuit (IC) chips and data readout integrated circuit (IC) chips to increase the overall bendability of the various active matrix backplane arrangement designs discussed herein.

An aspect of the present disclosure is that bendable active matrix backplane arrangements, such as described herein may be used in a variety of implementations, including but not limited to x-ray detector backplanes. Such arrangements can be fabricated from conventional a-Si technology and the limited bendability arising from the presence of rigid the driver chips along the direction of curvature of the TFT backplane array can be either substantially reduced or completely eliminated by specific embodiments described herein. Bendability is important for applications such as detecting weld failures in pipelines, monitoring other curved structures, threading the imager into tight spaces and some medical applications.

It is to be understood that aspects of the various embodiments may be incorporated and/or combined with other embodiments described herein whereby combinations of such embodiments may define further designs.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. An active matrix backplane arrangement comprising:
    a TFT backplane formed on at least one of a flexible substrate or a bendable substrate; and
    gate addressing circuits and data addressing circuits configured to address the TFT backplane, wherein at least one of the gate addressing circuits or the data addressing circuits are at least one of configured or positioned to enhance bendability of the arrangement.

2. The arrangement according to claim 1 wherein the gate addressing circuits are gate chip on flex (COF) packages, and the data addressing circuits are data chip on flex (COF) packages.

3. The arrangement according to claim 2 wherein the gate addressing circuits and the data addressing circuits include rigid silicon chips in the COF packages and at least one rigid gate silicon chip or rigid data silicon chip is purposely manufactured with fewer address lines resulting in a smaller chip, and a single one of these smaller silicon chips is provided to an individual COF package.

4. The arrangement according to claim 2 wherein the gate addressing circuits and the data addressing circuits include rigid silicon chips in the COF packages and at least one rigid gate silicon chip or rigid data silicon chip is purposely manufactured with fewer address lines resulting in a smaller chip, and multiple ones of these chips are provided to an individual COF package.

5. The arrangement according to claim 2 wherein the gate addressing circuits and the data addressing circuits include rigid silicon chips in the COF packages, and wherein each of the rigid silicon chips are oriented in the COF package so that their longest dimensions are parallel when connected to the TFT backplane.

6. The arrangement according to claim 2 wherein the gate addressing circuits and the data addressing circuits include rigid silicon chips in the COF packages, and wherein gate COFs and data COFs are collinearly placed along a same side of the TFT backplane.

7. The arrangement according to claim 2 wherein the gate addressing circuits and the data addressing circuits include rigid silicon chips in the COF packages, and wherein each of the gate COF packages include at least a single silicon chip, the at least single silicon chip being a thinned IC, wherein the thickness of the thinned IC is less than 50 µm in thickness.

8. The arrangement according to claim 1 wherein the wherein the gate addressing circuits and the data addressing circuits are mounted directly to the bendable substrate.

9. The arrangement according to claim 1 wherein the gate addressing circuits and the data addressing circuits include at least one thinned silicon chip located directly on the flexible substrate, and wherein the thickness of the thinned silicon chip is less than 50 µm in thickness.

10. The arrangement according to claim 1 wherein the gate addressing circuits are formed using low temperature poly-Si (LIPS), and the data addressing circuits include silicon chips in the COF packages.

11. The arrangement according to claim 1 wherein the gate addressing circuits are formed using amorphous Indium Gallium Zinc Oxide (a-IGZO) or other metal oxide, and the data addressing circuits include silicon chips in the COF packages.

12. The arrangement according to claim 1 wherein the wherein the gate addressing circuits and the data addressing circuits and all other silicon ICs are all thin circuits equal to or less than 50 µm in thickness, and all the thin circuits are directly bonded to the bendable substrate, with no printed circuit board in the arrangement.

13. The arrangement of claim 2, wherein the TFT backplane formed on the flexible or bendable substrate is a plastic substrate, with gate and data addressing circuits modified from conventional COF or chip on glass packages to enhance the bendability of the TFT backplane.

14. The arrangement according to claim 1, wherein the TFT backplane arrangement is an x-ray detector backplane.

15. The arrangement according to claim 1 being one of a liquid crystal display (LCD), an organic liquid crystal display (OLED) and a reflective display.

16. A method of forming a bendable or flexible TFT backplane system comprising:
    forming a TFT backplane on at least one of a flexible substrate or a bendable substrate; and
    configuring gate addressing circuits and data addressing circuits configured to address the TFT backplane, wherein at least one of the gate addressing circuits or the data addressing circuits are at least one of configured or positioned to enhance bendability of the arrangement.

* * * * *